United States Patent

Sharpe-Geisler

[11] Patent Number: 5,844,912
[45] Date of Patent: Dec. 1, 1998

[54] FAST VERIFY FOR CMOS MEMORY CELLS

[75] Inventor: Bradley A. Sharpe-Geisler, San Jose, Calif.

[73] Assignee: Advanced Micro Devices, Inc., Sunnyvale, Calif.

[21] Appl. No.: 831,372

[22] Filed: Apr. 1, 1997

[51] Int. Cl.[6] ............................. G11C 29/00; G11C 16/04
[52] U.S. Cl. ..................... 371/21.1; 365/185.01
[58] Field of Search .................... 371/21.1, 22.1, 371/22.2; 365/185.01, 185.02, 185.08, 185.1, 200, 201, 218

[56] References Cited

U.S. PATENT DOCUMENTS

| | | | |
|---|---|---|---|
| 5,272,368 | 12/1993 | Turner et al. | 365/185.09 |
| 5,587,945 | 12/1996 | Lin et al. | 365/185.01 |
| 5,596,524 | 1/1997 | Lin et al. | 365/185.01 |
| 5,666,309 | 9/1997 | Peng et al. | 365/185.08 |

*Primary Examiner*—Trinh L. Tu
*Attorney, Agent, or Firm*—Fliesler, Dubb, Meyer & Lovejoy

[57] ABSTRACT

A method of verifying functionality of a circuit including an array of CMOS memory cells, each memory cell including: an NMOS transistor and a PMOS transistor having a common floating gate and drains connected together to form an output; a control capacitor having a first terminal connected to the common floating gate; a first transistor having a source to drain path connecting a second terminal of the control capacitor to a control gate (CG) node and having a gate forming a wordline (WL) node; and a tunneling capacitor connecting a write control (WC) node to the common floating gate, wherein a row of memory cells in the array have CG nodes connected together and wherein a column of memory cells in the array have CG nodes connected together, the method including the steps of: (a) programming all memory cells in a selected row (b) applying $V_{VER}$ ($\approx$1.8V) to the CG and WC nodes of the cells in the selected row while applying a voltage $V_{VER'}$ ($V_{VER}$ plus an NMOS threshold) to WL nodes; (c) raising the WL nodes of selected cells in the selected row to $V_{MUXVER'}$ ($V_{MUXVER'}$ being $V_{MUXVER}$ or $\approx$6V plus an NMOS threshold); (d) lowering the WL nodes of unselected cells to $V_{VER'}$; and (e) raising the CG nodes of the selected cells to $V_{MUXVER}$ so that selected cell outputs go low. Once functional verification is performed with selected cells as chosen in steps (a–e), the selected cells are charged and steps (b–e) are repeated until all desired patterns of cells in the selected row have been selected in a functional verification process. Steps (a–e) are then repeated for a next selected row. The process of the present invention enables toggling the output of the selected cells from a programmed or low state to a high state without requiring that the selected cell be reprogrammed.

4 Claims, 5 Drawing Sheets

FAST VERIFY FOR CMOS MEMORY CELLS

BACKGROUND OF THE INVENTION

1. Field of the Invention

The present invention relates to a method for verifying the functionality of a circuit containing the CMOS memory cells by programming functional patterns in the memory cells of the CMOS memory array and then verifying operation of the circuit containing the CMOS memory cells for each functional pattern.

2. Description of the Related Art

FIG. 1 shows a conventional CMOS memory cell. The memory cell includes a PMOS transistor 100 and an NMOS transistor 102 with a common floating gate. Drains of transistors 100 and 102 are connected together to form the output (OUT) for the CMOS memory cell. The source of the PMOS transistor 100 is shown connected to a voltage source Vcc. Vcc is a typical pin supply voltage of which may be approximately 5 volts, or 3 volts, or another voltage depending on device specifications. The source of the NMOS transistor 102 is shown connected to Vss, which is typically at ground.

The CMOS memory cell further includes a control gate capacitor 104, and pass transistor 106. The control gate capacitor 104 has a first terminal connected to the common floating gate of transistors 100 and 102 and a second terminal connected to a drain of transistor 106. The capacitor 104 includes an oxide layer of approximately 200 Å between the floating gate of transistors 100 and 102 and a drain region of a pass transistor 106. The pass transistor 106 is an NMOS device having a source forming a control gate (CG) node for the memory cell. The gate of transistor 106 further forms a word line (WL) voltage node.

The CMOS memory cell further includes a tunneling capacitor 108 having one terminal connected to the common floating gate of transistors 100 and 102, and another terminal forming a word control (WC) node. The tunneling capacitor 108 includes an oxide layer of approximately 85 Å between the floating gate of transistors 100 and 102 and an implanted region of a device connected to the WC node. The thin tunneling oxide layer enables the tunneling capacitor 108 to function to allow charge to be added to the common floating gate of transistors 100 and 102 during erase, and subtracted from the floating gate during programming.

The CMOS memory cell shown in FIG. 1 and described above is disclosed in U.S. Pat. No. 5,272,368 and in U.S. Pat. No. 4,885,719.

FIG. 2 illustrates how the CMOS memory cells of FIG. 1 are typically included in an array of memory cells $C_{11}$–$C_{33}$. In the array, lines $WC_{1-3}$ and lines $CG_{1-3}$ run parallel to rows of the memory cells, while lines $WL_{1-3}$ run parallel to columns of the memory cells. Each row of memory cells have WC nodes connected to a common one of the lines $WC_{1-3}$, and CG nodes connected to a common one of the lines $CG_{1-3}$. Further, each column of memory cells has WL nodes connected to a common one of the lines $WL_{1-3}$.

In a programmable logic device (PLD), the outputs (OUT) of cells in an array, such as the array of FIG. 2, can serve to provide signals to subsequent circuitry. FIG. 3 shows components of a typical field programmable gate array (FPGA) which is a PLD and includes a configuration memory array 300 which can be made up of CMOS memory cells as illustrated in FIGS. 1 and 2. The FPGA of FIG. 3 additionally includes input/output blocks (IOBs), an array of configurable logic blocks (CLB0–CLB3) and resources for interconnection of the CLBs. The IOBs are arranged around the perimeter of the device and provide an interface between internal components of the FPGA and external package pins. The CLBs are programmed to implement Boolean functions. The interconnect resources connect the CLBs and IOBs and include interconnect lines, programmable interconnect points (PIPs), such as 302, and switching matrixes (SMs). The PIPs, switching matrices and internal components of the CLBs are configured by memory cells in the configuration memory array 300.

FIG. 4 shows a connection of one cell 400 from the configuration memory array 300 of FIG. 3 to a PIP or a switch matrix. As shown, the memory cell 400 has its output (OUT) connected to the gate of a pass gate 402 making up the PIP or a portion of a switch matrix 404 and functions to make or break a connection in the PIP or switch matrix by turning the pass gate 402 on or off.

Although not shown, the memory cells of the configuration memory array 300 can also be used to provide inputs to a multiplexer in the CLB to control look up tables in the CLB.

To verify functionality of circuitry in the PLD, a chip manufacturer will typically program multiple functional patterns into the cells of its configuration memory, such as configuration memory 300 of FIG. 3, and test circuitry tested to assure it functions properly. For example, with a multiplexer having inputs provided by cells in the configuration memory, functional patterns will typically be programmed into the configuration memory cells to test all possible input combinations to the multiplexer to assure the multiplexer provides appropriate outputs.

Thus, as a part of each functional verification process, cells are programmed by applying appropriate voltages, and a normal verify procedure is performed to assure that each cell in the configuration memory array is appropriately programmed or erased as desired. After the normal verify procedure, functional verification voltages are applied to the memory cells in the configuration memory so that their outputs (OUT) will go to high or low, depending on whether the cell is programmed or erased, so that circuitry connected to the memory cells can be functionally tested.

Table I shows typical voltages applied on the CG, WL and WC nodes of a selected cell in the array of FIG. 2 through respective ones of the lines $CG_{1-3}$, $WL_{1-3}$ and $WC_{1-3}$ during erase, program, and normal verify. Also shown in Table I are voltages applied to the lines $WL_{1-3}$ $CG_{1-3}$ and $WC_{1-3}$ which are not connected to the selected cell.

TABLE I

|  | Selected Cell Lines | | | Unselected Lines | | |
| --- | --- | --- | --- | --- | --- | --- |
|  | CG | WC | WL | CG | WC | WL |
| Erase | 0V | $V_{PP}$ | Vcc | 0V | 0V | N/A |
| Program | $V_{PP}$ | 0V | $V_{PP}$+ | $V_{PP}$ | 0V | 0V |
| Normal Verify | $V_{VER}$ | $V_{VER}$ | Vcc | $V_{VER}$ | $V_{VER}$ | 0V |

The voltage $V_{PP}$ in Table I is a programming voltage typically around 13V. The voltage $V_{PP'}$ is an NMOS threshold higher than $V_{PP}$ to assure transistor 106 will turn on with $V_{PP}$ applied to its CG node. As indicated previously, Vcc is a typical pin supply voltage which may be 5V, or 3V, or another voltage. The voltage $V_{VER}$ is a voltage which may be selected to equalize cell erase and program margins, as explained in more detail below, and can be approximately 3V when Vcc is 5V, or 1.8V when Vcc is 3V.

During programming or erase a $V_{PP}$ pulse is applied to the appropriate lines $WC_{1-3}$ or $CG_{1-3}$. After the $V_{PP}$ pulse, the normal verify voltages are applied to assure enough charge has been added or subtracted from the floating gate for the program or erase procedure to be complete.

The voltage $V_{VER}$ applied during normal verify will be selected in a range so that neither the PMOS transistor 100 nor the NMOS transistor 102 is completely turned off when zero charge is on the floating gate, enabling charge to be added or subtracted from the floating gate to turn off either the PMOS transistor 100 or NMOS transistor 102. To achieve more efficient operation, the voltage $V_{VER}$ can be adjusted to equalize the program and erase margins, so that with zero charge initially stored on the floating gate, an equal amount of charge must be added to the floating gate to turn off the PMOS transistor 102 as must be removed from the floating gate to turn off the NMOS transistor 102.

FIG. 5 shows a configuration for a memory cell of FIG. 1 to enable normal verify with the normal verify voltages applied as shown in Table I. As shown, a transistor 500 is utilized having a gate connected to the output (OUT) of the cell and a drain connected to a verify bit line. The verify bit line runs parallel to a row of cells and will be connected to each cell in the row. Another transistor 502 has a source connected to ground, a drain connected to the source of transistor 500, and a gate connected to the WL node of the cell. During normal verify a current source is applied to the bit line and a measurement of the voltage on the bit line is made to determine if a selected cell is turned on or off. Transistor 502 is utilized to enable a cell to be selected for normal verify testing as determined by a WL node applied to its gate.

For Table I, and in subsequent information provided herein, a cell is termed erased when positive charge is applied to its floating gate which is sufficient to turn off the PMOS transistor 102 to a degree that OUT appears low during verify mode. A cell is termed programmed when there is negative charge on the floating gate which is sufficient to turn off the NMOS transistor 100 to a degree that OUT is high during verify mode.

The separate lines $CG_{1-3}$ allow row by row erase. With row by row erase, all lines $WL_{1-3}$ will be connected to a cell being erased during an erase procedure, so in Table I there will be no unselected lines $WL_{1-3}$ and a N/A state is indicated for the WL lines.

The separate lines $WL_{1-3}$ allow individual cells to be programmed in the row having a programming voltage $V_{PP}$ applied over its CG line. The lines $WL_{1-3}$ further allow verifying of the program or erase state of a selected cell in a row.

To verify functionality of the circuitry of a PLD, such as the FPGA of FIG. 3, multiple functional patterns are erased or programmed into its configuration memory, and operation of the PLD is tested with each functional pattern. Voltages conventionally applied during functional verify will be the voltages listed in Table I under "normal verify" with all cells in the array being selected. In other words, $V_{VER}$ is applied to all of the lines $CG_{1-3}$ and $WC_{1-3}$, while Vcc is applied to all the lines $WL_{1-3}$. With such voltages applied, each cell will provide a signal at its output OUT depending on whether it is programmed or erased, and will accordingly drive additional circuitry in the PLD, such as pass gate 404 of FIG. 4, enabling functionality of the complete integrated circuit to be tested.

The process of programming or erasing during functionality verification, however, is time consuming and expensive, costing a manufacturer nearly as much as the cost of the part being tested. It typically requires at least 1 millisecond to program each row for functional pattern. Many such functional patterns are required for circuit testing which may include 100 or more rows.

SUMMARY OF THE INVENTION

The present invention provides a method for verifying the functionality of a circuit containing CMOS memory cells which significantly reduces time and associated costs previously required for functional verification.

The present invention is a method of verifying functionality of a circuit including an array of memory cells connected as shown in FIG. 2, each memory cell being configured as shown in FIG. 1, the method comprising the steps of:

(a) programming a functional pattern in the array of cells;

(b) programming all memory cells in a selected row; and (c) applying $V_{VER}$ to the CG and WL nodes of the cells in the selected row while applying Vcc to the WL nodes of the cells in the selected row;

(d) raising voltage on the WL nodes of one or more selected cells in the selected row to $V_{MUXVER^t}$, $V_{MUXVER^t}$ being an NMOS threshold higher than a voltage $V_{MUXVER}$;

(e) lowering the voltage on the WL nodes of the unselected cells in the selected row to 0V; and (f) raising the voltage on the CG nodes of the selected cells in the selected row to $V_{MUXVER}$, $V_{MUXVER}$ can be lower than $V_{PP}$, but remaining sufficiently high that the output of the selected cells should be low. In one embodiment, $V_{MUXVER}$ is 6V.

Once functional verification is performed using steps (b–f), the selected cells are column shifted down the row and steps (c–f) are repeated until all cells in the selected row have been selected. The selected row is then erased, reprogrammed with the functional pattern, and steps (b–f) are repeated for a next selected row.

The process of the present invention enables toggling the output (OUT) of the selected cells from a programmed or low state to a high state without requiring that the selected cells be erased and reprogrammed between each test. Utilizing the process of the present invention, the 1 millisecond time period required to program each cell for a particular functional pattern can be reduced to approximately a 1 microsecond time period required to toggle the selected cell outputs for a significant portion of the functional patterns. Overall verification testing and its associated costs are, thus, significantly reduced.

BRIEF DESCRIPTION OF THE DRAWINGS

Further details of the present invention are explained with the help of the attached drawings in which.

DETAILED DESCRIPTION

Figure 1:
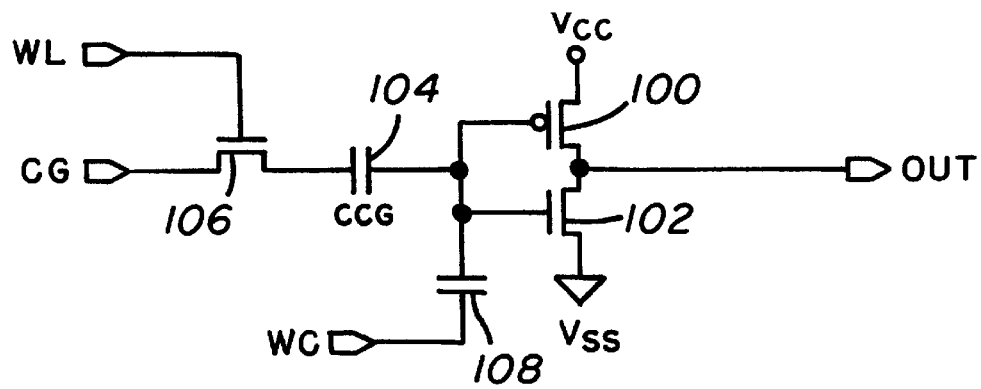
FIG. 1 shows a conventional CMOS memory cell.
Figure 2:
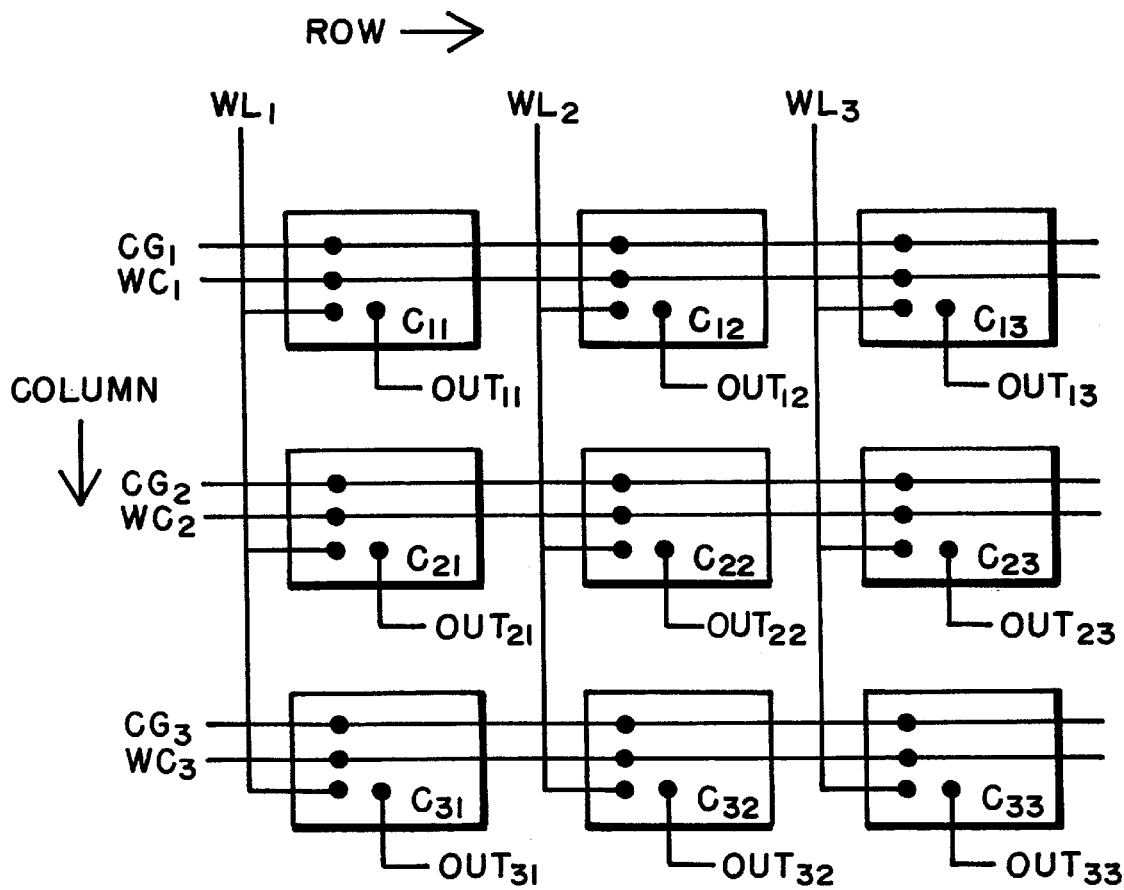
FIG. 2 illustrates how memory cells, such as the cell of FIG. 1 can be configured in an array in a PLD.
Figure 3:
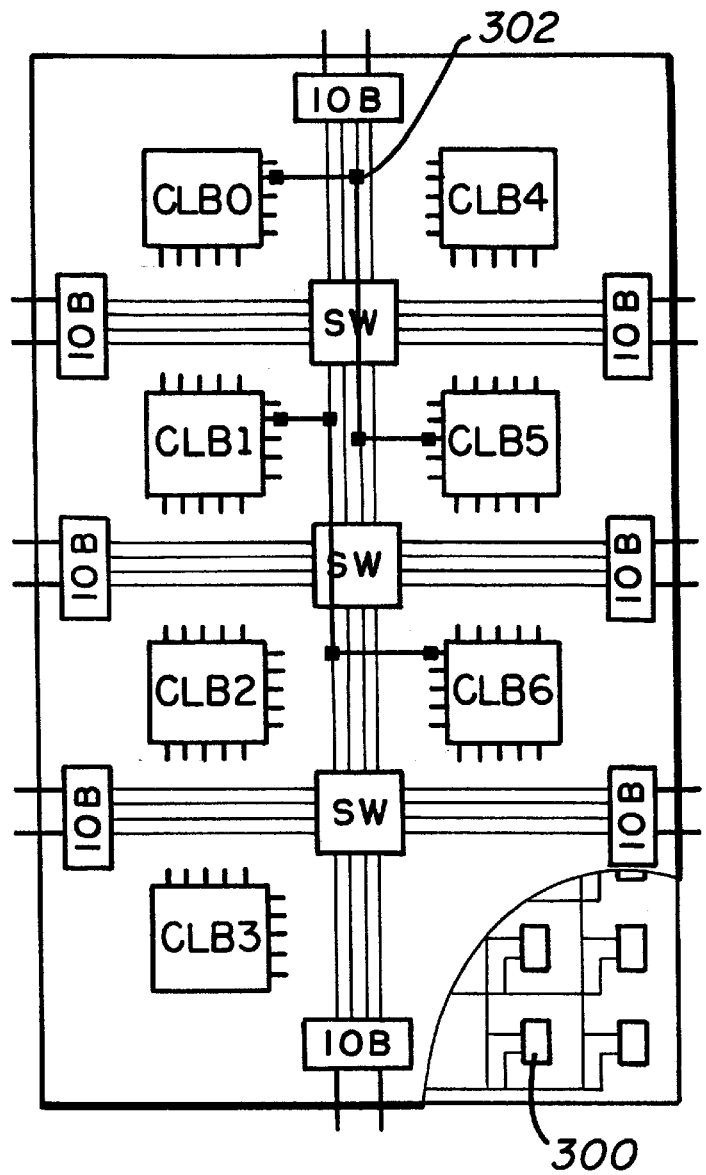
FIG. 3 shows components of a typical FPGA which includes a configuration memory array which can be made up of CMOS memory cells configured as illustrated in FIG. 2.
Figure 4:
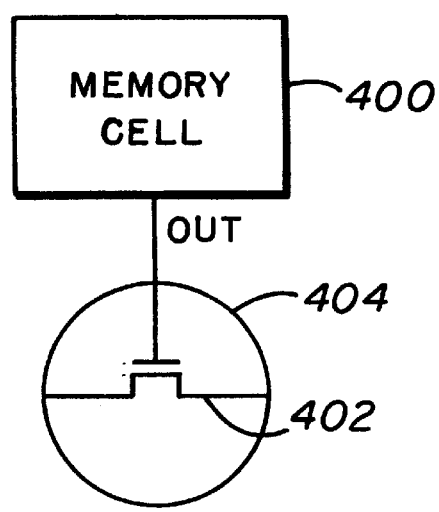
FIG. 4 shows a connection of a cell from the configuration memory of the FPGA of FIG. 3 to circuitry in the FPGA.
Figure 6:
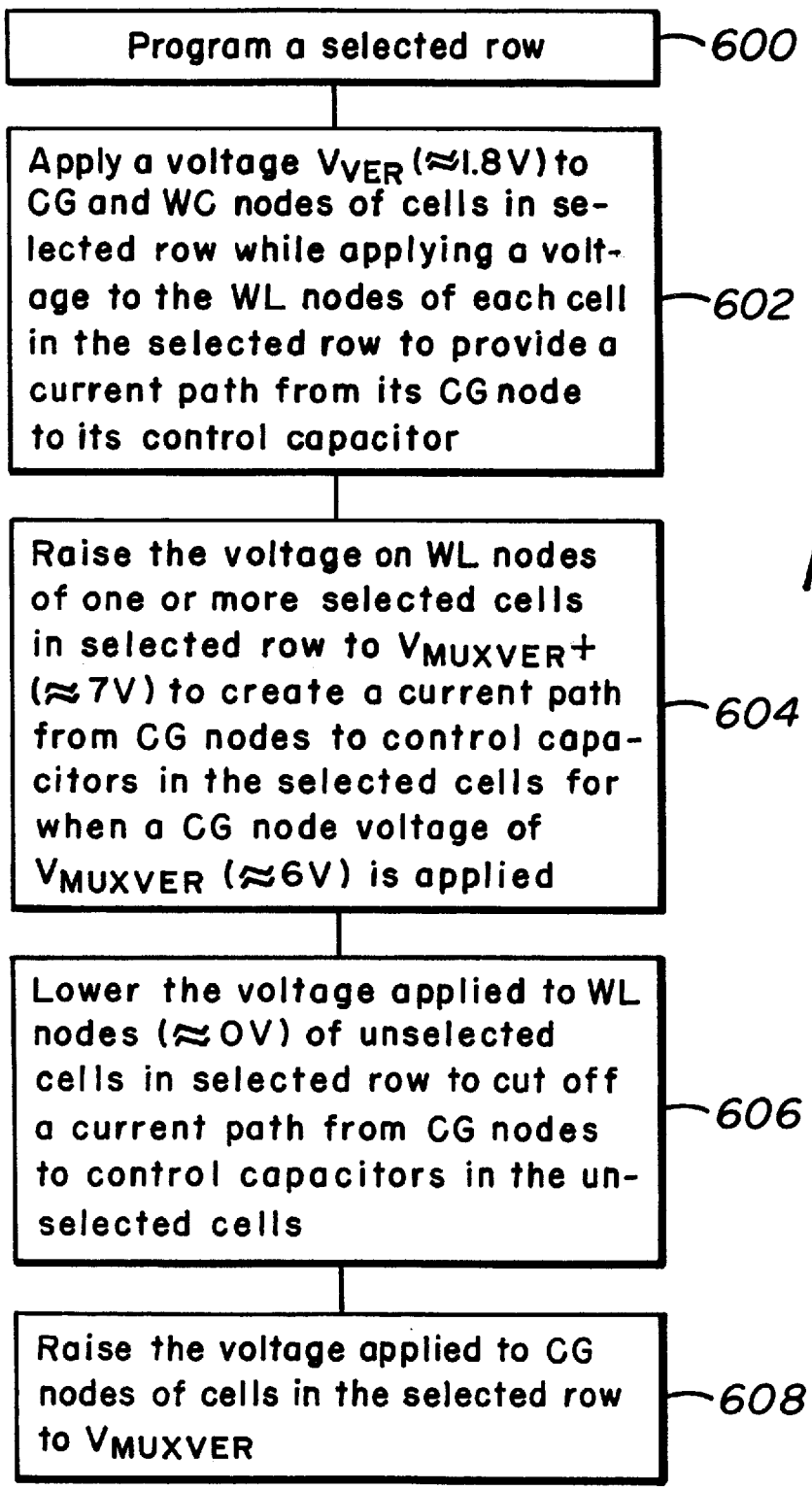
FIG. 6 shows a shows a flow diagram including steps performed for the process of the present invention.

FIG. 6 shows a flow diagram including steps performed for the process of the present invention. The steps of FIG. 6 are applied to an array of CMOS memory cells configured as shown in FIG. 2 using memory cells as shown in FIG. 1. For further reference, Table II below summarizes functional verification voltages applied to the lines $WL_{1-3}$, $CG_{1-3}$ and $WC_{1-3}$ in the circuit of FIG. 2 the process of the present invention as described in detail below.

TABLE II

| Selected Cell Lines | | | Unselected Lines | | |
|---|---|---|---|---|---|
| CG | WC | WL | CG | WC | WL |
| $V_{MUXVER}$ | $V_{VER}$ | $V_{MUXVER}+$ | $V_{VER}$ | $V_{VER}$ | 0V |

In Table II, the voltage $V_{VER}$ is the voltage described previously which is sufficient to turn on both the PMOS and NMOS transistors of a cell when applied to its WC and CG nodes with Vcc applied to its WL node and zero charge stored on its floating gate. The voltage $V_{VER}$ can be adjusted to maximize program and erase margins also, as described above. The voltages $V_{MUXVER}$ and $V_{MUXVER^t}$ are voltages which are determined as described below.

In step 600, cells in a selected row are programmed. Programming is performed for each cell by applying $V_{PP}$ pulses along with other voltages as indicated in Table I to cells in the row and then normal verify voltages identified in Table I are applied after the $V_{PP}$ pulse to assure the selected cell has been appropriately programmed. As indicated previously, a cell is termed programmed when there is sufficient negative charge on the floating gate of the memory cells to turn off its NMOS transistor (and turn on the PMOS) to a degree that the output of the cell is high during verify mode. A cell is termed erased when charge on its floating gate enables its PMOS transistor to turn off (and turn on the NMOS) to a degree that the output of the cell appears low during verify mode.

In step 602, the voltage $V_{VER}$ is applied to the WC nodes of cells in the selected row, while a voltage is applied to the CG and WL nodes of each cell in the selected row to turn on its transistor 106 to provide the voltage $V_{VER}$ from its CG node to its control capacitor 104. Note that voltages applied in step 602 may be the voltages applied during the verify procedure of Table I with all cells in the selected row being selected. The voltages in step 602 are applied to remove any excess charge trapped between capacitor 104 and transistor 106 after programming. Step 602 also enables $V_{VER}$ to be applied to capacitor 104 for a time period after transistor 106 is turned off so that the output (OUT) of the cell will still enable determination of whether it is programmed or erased.

In step 604, the voltage applied to WL nodes of one or more selected cells in the selected row is raised to enable turn on of pass gate 106 in the selected cells to pass a voltage $V_{MUXVER}$ from the corresponding CG nodes of the selected cells. Note that the voltage applied to the selected WL nodes may be $V_{MUXVER^t}$ ($V_{MUXVER}$ plus an NMOS threshold) as shown in Table II, or greater with $V_{MUXVER}$ applied to the CG node of the selected cell. With a voltage greater than $V_{MUXVER}$ applied to the CG node of a selected cell, the WL voltage to assure passage of $V_{MUXVER}$ to the capacitor 104 will more likely be $V_{MUXVER^t}$.

In step 606, the voltage applied to WL nodes of unselected cells in the selected row is lowered to a value sufficient to pass no voltage higher than $V_{VER}$ through pass gates 106 in the unselected cells. The voltage applied to the WL nodes of unselected cells may, thus, be at ground as indicated in Table II.

In step 608, a voltage $V_{MUXVER}$ is applied to the CG nodes of the cells in the selected row. Also, as indicated above, the voltage applied to the CG node may be greater than $V_{MUXVER}$ if a WL node voltage applied limits the voltage passed from transistor 106 to capacitor 104 to $V_{MUXVER}$. The voltage $V_{MUXVER}$ is a voltage reduced from $V_{PP}$, but remaining high enough so that the output of the selected cells will be low. In one embodiment of the present invention $V_{MUXVER}$ is approximately 6V.

After step 608, testing of circuitry connected to the memory cells can be performed with the unselected cells of the selected row assumed to be programmed, or having a high output, while the selected cells are assumed to have a low output, or appear erased. Applying and removing the $V_{MUXVER}$ voltage from floating gates to toggle selected cell outputs between a programmed and erased state for the purposes of testing circuitry takes on the order of 1 microsecond, whereas actually erasing and reprogramming cells takes on the order of 1 millisecond per programmed cell. Thus, the procedure of the present invention enables a substantial reduction in the time required for a manufacturer to test a circuit containing a CMOS memory array. Note that applying $V_{MUXVER}$ as a high voltage, such as 6V as described above, will not disturb the programmed state of cells, unlike if cells were in an erased state.

Figure 7:
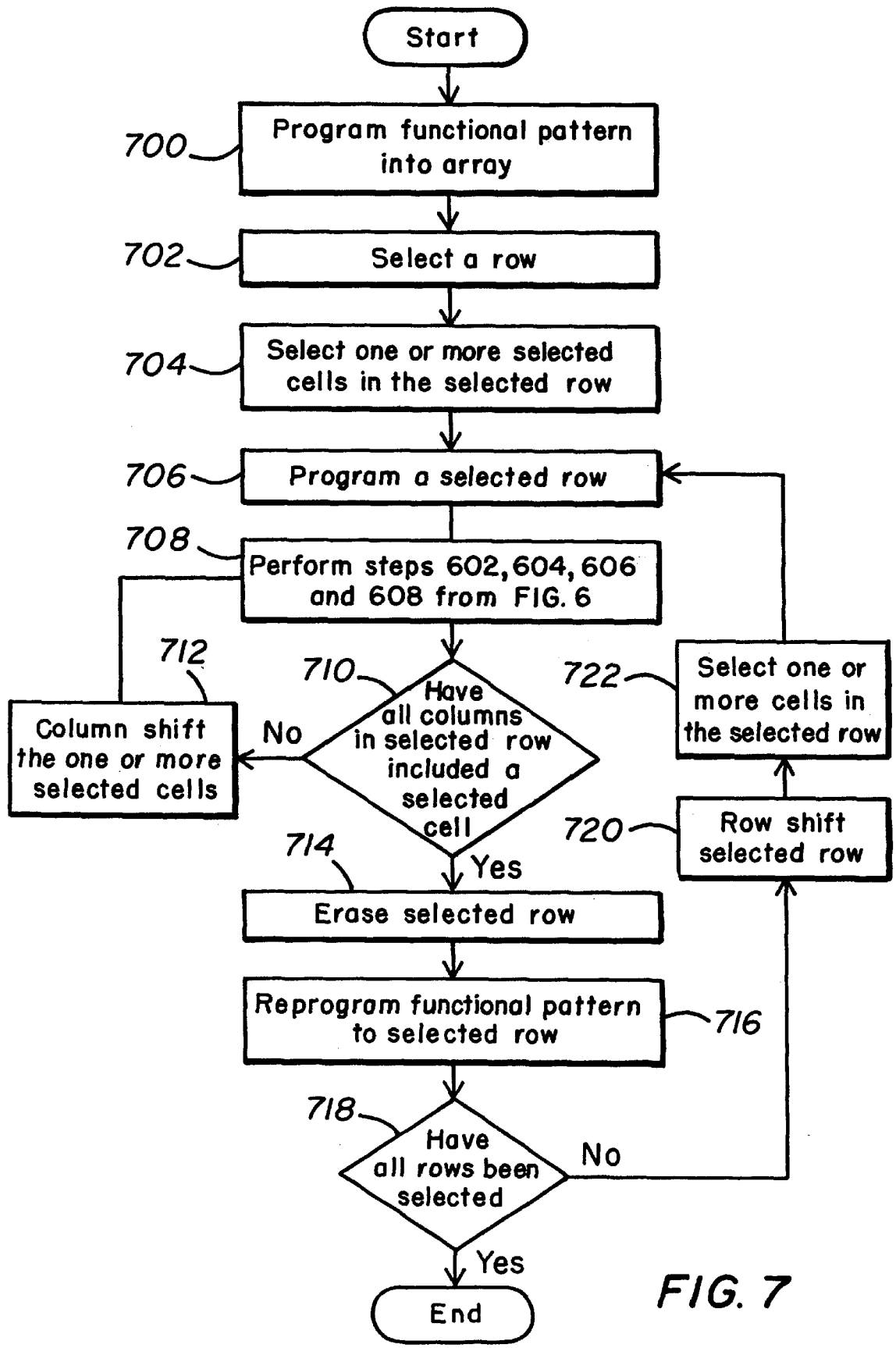
FIG. 7 shows a flow diagram for the procedure of the present invention including steps to enable testing of circuitry using a special functional pattern of programmed cells.

FIG. 7 shows a flow diagram for the procedure of the present invention, including the steps from FIG. 6, and further including steps to enable testing of circuitry using a special functional pattern of programmed cells.

In a first step 700 a special functional pattern of cells is programmed into the array. As indicated previously, for cells to be programmed in the array, programming is performed for each cell by applying $V_{PP}$ pulses as shown in Table I and then verifying after each $V_{PP}$ pulse using verify voltages of Table I until the cell is verified to be appropriately programmed.

In step 702 a first row of cells is selected, and then in step 704 one or more cells in the selected row are selected. Next, in step 706 a row of cells is programmed as described with respect to step 600 in FIG. 6. Then, in step 708, the steps 602, 604, 606 and 608 from FIG. 6 are performed, as described above, and the circuitry in which the CMOS array is included is tested to assure it performs properly.

In step 710 a check is made to determine if all cells of the selected row have been selected for testing using step 708. If not, the selected cells are column shifted in step 712 and step 708 is reapplied for the newly selected cells. If all cells in the selected row have been previously selected, the process proceeds to step 714.

In step 714, the selected row is erased, and in step 716, the selected row is reprogrammed to reinstate the special functional pattern programmed in step 700.

In step 718, a check is made to determine if all rows have been selected for testing. If so, the process ends. If not, the process proceeds to step 720 wherein a newly selected row is chosen and in step 722 one or more cells are selected. After step 722, the process proceeds again with step 706.

Although the method of the present invention is described for use with a cell shown in FIG. 1, the present invention can also be used with a CMOS memory cell which does not utilize a tunneling capacitor as shown in U.S. Pat. No.

5,596,524, which is incorporated herein by reference. An additional transistor such as transistor 106 of FIG. 1 will, however, be needed to connect to the control gate (ACG connection) of the memory cell utilized in U.S. Pat. No. 5,596,524 so that unselected cells may be isolated using a WL voltage applied to the gate of the additional transistors during the functional verification procedure of the present invention, as described above.

Figure 5:
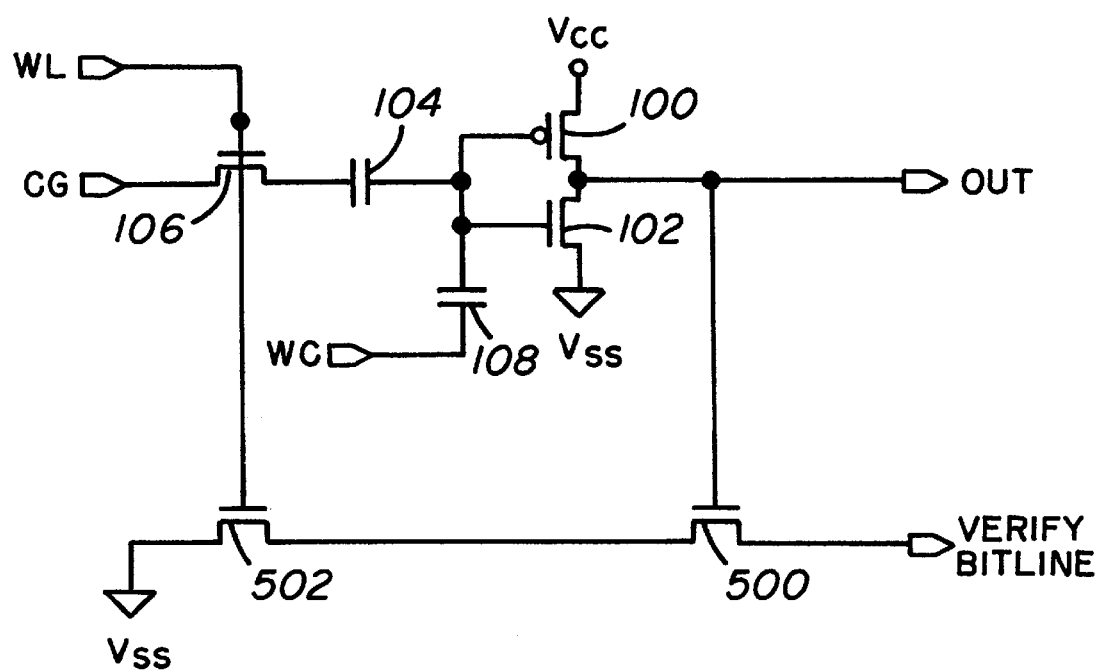
FIG. 5 shows a configuration for a memory cell of FIG. 1 to enable normal verify operation.

The availability of the $V_{MUXVER}$ voltage for the CG nodes of the memory cells can also enable normal verify to be performed using less chip resources. With normal verify voltages applied as described previously using the circuit of FIG. 5, the VERIFY BITLINE connection for each cell must be connected to other cells in a row of cells, rather than being connected together with all memory cells in the array. If all cell VERIFY BITLINEs were connected together during normal verify as described previously, cells in unselected rows receiving the selected WL voltage of Vcc would turn on along with the selected cell in the selected row providing an erroneous reading. With the voltage applied to CG nodes of cells in unselected rows during normal verify raised to $V_{MUXVER}$, the outputs of the unselected cells will be low when a WL voltage of $V_{MUXVER}+$ is used on selected cells and OV on unselected cells. Thus, with $V_{MUXVER}$ applied to unselected CG lines, only the selected cell in the selected row will be tested when the VERIFY BITLINEs of all cells are connected together. With all cell VERIFY BITLINEs connected together, less lines are required on a chip, and less testing circuitry is required because only one connection is required for normal verify testing as opposed to one connection previously required for each bitline.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A method of verifying functionality of a circuit, the circuit including an array of memory cells, each memory cell including: an NMOS transistor and a PMOS transistor having a common floating gate and drains connected together to form an output; a control capacitor having a first terminal connected to the common floating gate; and a first transistor having a source to drain path connecting a second terminal of the control capacitor to a control gate (CG) node and having a gate forming a wordline (WL) node, wherein a row of the memory cells in the array have CG nodes connected together, and wherein a column of the memory cells in the array have WL nodes connected together, the method comprising the steps of:

(a) selecting a row in the array of memory cells;

(b) programming memory cells in the selected row by applying at least a programming pulse $V_{PP}$ to the CG node of the cells in the selected row, wherein programming results in each memory cell in the selected row having an output which should be in a first state when a voltage $V_{VER}$ is applied to the CG node of each cell in the selected row while a voltage is applied to the WL node of the cell sufficient to provide a current path from the CG node to the first terminal of the control capacitor in the cell, $V_{VER}$ being sufficient to turn on both the PMOS and NMOS transistors of the cell if zero charge were stored on the floating gate of the cell;

(c) selecting at least one cell in the selected row;

(d) applying a voltage to the CG nodes of the cells in the selected row while applying a voltage to the WL nodes of the cells in the selected row to pass the voltage $V_{VER}$ to the second terminal of the control capacitor of the cells in the selected row;

(e) providing a voltage on the WL nodes of the at least one selected cell in the selected row to a voltage sufficient to turn on the first transistor in the at least one selected cell to pass a voltage $V_{MUXVER}$ from the CG node of the at least one selected cell;

(f) lowering the voltage on the WL nodes of unselected cells in the selected row sufficient to turn off the first transistor so that it does not pass $V_{MUXVER}$ in the unselected cells; and (g) raising voltage on the CG nodes of the cells in the selected row to provide $V_{MUXVER}$ to the second terminal of the control capacitor, $V_{MUXVER}$ being altered from $V_{PP}$, but remaining sufficient so that the output of the at least one selected cell should be in a second state.

2. The method of claim 1, wherein each memory cell further includes a tunneling capacitor connecting a write control (WC) node to the common floating gate, and in step (d), the voltage ($V_{VER}$) is applied to the WC node of the cells in the selected row.

3. The method of claim 1, wherein prior to the step (a) the method includes the step of programming a pattern of selected cells in each row in the array of cells, and wherein after the step (g) the method further comprises the steps of:

(h) determining if all columns in the selected row have previously included a selected cell and if not proceeding to step (i) and if so proceeding to step (j);

(i) column shifting the at least one selected cell so that the at least one selected cell occupies at least one other column which has not been previously selected and proceeding to step (d);

(j) erasing the cells in the selected row;

(k) reprogramming the pattern of selected cells previously programmed in the selected row;

(l) determining if all the rows in the memory array have been previously selected and if not proceeding to step (m);

(m) changing the selected row in the array of memory cells to another row which has not previously been selected and proceeding to step (b).

4. A method of verifying functionality of a circuit, the circuit including an array of memory cells, each memory cell including: an NMOS transistor and a PMOS transistor having a common floating gate and drains connected together to form an output; a control capacitor having a first terminal connected to the common floating gate; a first transistor having a source to drain path connecting a second terminal of the control capacitor to a control gate (CG) node and having a gate forming a wordline (WL) node; and a tunneling capacitor connecting a write control (WC) node to the common floating gate, wherein a row of the memory cells in the array have CG nodes connected together and WC nodes connected together, and wherein a column of the memory cells in the array have WL nodes connected together, the method comprising the steps of:

(a) programming a pattern of selected cells in each row in the array of cells by applying at least a programming pulse ($V_{PP}$) to the CG nodes while applying $V_{SS}$ to the WC node of a cell to be programmed, wherein programming results in a memory cell having an output which should be at $V_{SS}$ when a voltage ($V_{VER}$) is applied to the CG and WC nodes of the cell and a voltage is applied to the WL node of the cell sufficient to provide a current path from the CG node to the first terminal of the control capacitor in the cell, $V_{VER}$ being sufficient to turn on both the PMOS and NMOS transistors of the cell if zero charge were stored on the floating gate of the cell;

(b) selecting a row in the array of memory cells;

(c) programming the selected row;

(d) applying a voltage to the CG and WC nodes of the cells in the selected row while applying a voltage to the WL nodes of the cells in the selected row to pass the voltage $V_{VER}$ to the second terminal of the control capacitor of the cells in the selected row;

(e) providing a voltage on the WL nodes of the at least on selected cell in the selected row wherein the voltage is sufficient to turn on the first transistor in the at least one selected cell to pass a voltage $V_{MUXVER}$ from the CG node of the at least one selected cell;

(f) lowering the voltage on the WL nodes of the unselected cells in the selected row sufficient to turn off the first transistor so that it does not pass $V_{MUXVER}$ in the unselected cells; and (g) raising voltage on the CG nodes of the selected cells in the selected row to provide $V_{MUXVER}$ to the second terminal of the control capacitor, $V_{MUXVER}$ being lower than $V_{PP}$, but remaining sufficient so that the output of the at least one selected cell should be at Vcc;

(h) determining if all columns in the selected row have previously included a selected cell and if not proceeding to step (i) and if so proceeding to step (j);

(i) column shifting the at least one selected cell so that the at least one selected cell occupies at least one other column which has not been previously selected and proceeding to step (d);

(j) erasing the cells in the selected row;

(k) reprogramming the pattern of selected cells previously programmed in the selected row;

(l) determining if all the rows in the memory array have been previously selected and if not proceeding to step (m);

(m) changing the selected row in the array of memory cells to another row which has not previously been selected and proceeding to step (c).

* * * * *